United States Patent
Clauss et al.

(10) Patent No.: US 8,570,488 B2
(45) Date of Patent: Oct. 29, 2013

(54) TRANSMITTING OPTICAL ELEMENT AND OBJECTIVE FOR A MICROLITHOGRAPHIC PROJECTION EXPOSURE APPARATUS

(75) Inventors: Wilfried Clauss, Tuebingen (DE); Michael Totzeck, Schwaebisch Gmuend (DE); Werner Mueller-Rissmann, Oberkochen (DE); Gisela Rissmann, legal representative, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 751 days.

(21) Appl. No.: 11/718,146
(22) PCT Filed: Dec. 8, 2005
(86) PCT No.: PCT/EP2005/013166
§ 371 (c)(1),
(2), (4) Date: Feb. 23, 2009
(87) PCT Pub. No.: WO2006/061225
PCT Pub. Date: Jun. 15, 2006

(65) Prior Publication Data
US 2009/0201478 A1    Aug. 13, 2009

Related U.S. Application Data

(60) Provisional application No. 60/634,792, filed on Dec. 9, 2004, provisional application No. 60/646,046, filed on Jan. 21, 2005, provisional application No. 60/715,813, filed on Sep. 9, 2005.

(51) Int. Cl.
*G03B 27/52* (2006.01)

(52) U.S. Cl.
USPC .................... 355/67; 355/30; 355/50; 355/53

(58) Field of Classification Search
USPC ............................ 355/30, 50, 52, 53, 67, 77
See application file for complete search history.

(56) References Cited

U.S. PATENT DOCUMENTS

| | | | | |
|---|---|---|---|---|
| 3,359,066 A | * | 12/1967 | Hatch et al. | 423/490 |
| 4,543,346 A | | 9/1985 | Matsui et al. | |
| 5,244,849 A | * | 9/1993 | Roy et al. | 501/120 |
| 5,536,244 A | | 7/1996 | Muller et al. | |
| 6,339,505 B1 | * | 1/2002 | Bates | 359/642 |

(Continued)

FOREIGN PATENT DOCUMENTS

| | | |
|---|---|---|
| EP | 0 332 393 | 9/1989 |
| EP | 1701179 A1 * | 9/2006 |

(Continued)

OTHER PUBLICATIONS

J. Burnett et al., "High-Index Materials for 193 nm and 157 Immersion Lithography," International Symposium on Immersion & 157 nm Lithography, Vancouver, Feb. 8, 2004.

(Continued)

*Primary Examiner* — Thomas R Artman
(74) *Attorney, Agent, or Firm* — Fish & Richardson P.C.

(57) ABSTRACT

A transmitting optical element adapted for use in an objective for a microlithographic projection exposure apparatus is composed of a polycrystalline material, with the polycrystalline material having crystallites with a cubic crystal structure, and with the mean crystallite size of these crystallites being at least micrometers, and at most micrometers.

35 Claims, 4 Drawing Sheets

(56) References Cited

U.S. PATENT DOCUMENTS

| | | | |
|---|---|---|---|
| 6,406,769 | B1 | 6/2002 | Delabre |
| 6,806,039 | B2* | 10/2004 | Allan et al. .................. 430/320 |
| 7,247,589 | B2 | 7/2007 | Krell et al. |
| 7,310,187 | B2 | 12/2007 | Epple et al. |
| 7,466,489 | B2* | 12/2008 | Beder et al. .................. 359/649 |
| 7,679,806 | B2* | 3/2010 | Wehrhan et al. ............. 359/256 |
| 7,791,811 | B2* | 9/2010 | Eva ............................... 359/649 |
| 2003/0160177 | A1* | 8/2003 | Mayolet et al. ............... 250/372 |
| 2004/0212107 | A1 | 10/2004 | Hasegawa |
| 2005/0215419 | A1 | 9/2005 | Takagimi et al. |
| 2006/0238735 | A1* | 10/2006 | Kamenov et al. ............. 355/67 |
| 2007/0091451 | A1* | 4/2007 | Schuster ....................... 359/649 |
| 2008/0186466 | A1* | 8/2008 | Sirat et al. .................... 355/55 |
| 2009/0251673 | A1* | 10/2009 | Clauss ........................... 355/30 |

FOREIGN PATENT DOCUMENTS

| | | | | |
|---|---|---|---|---|
| JP | 59-121158 | A | 7/1984 | |
| JP | 11-16601 | A | 5/1989 | |
| JP | 12-30464 | A | 9/1989 | |
| JP | 6-107456 | | 4/1994 | |
| JP | 2004-191920 | A | 7/2004 | |
| WO | WO 88/08829 | | 11/1988 | |
| WO | WO 03/055826 | A1 | 7/2003 | |
| WO | WO 2004/019128 | A2 | 3/2004 | |
| WO | WO 2004/097817 | A1 * | 11/2004 | ............ G11B 7/135 |
| WO | WO 2006/014540 | A2 | 10/2006 | |

OTHER PUBLICATIONS

J. Burnett et al., "High-Index Materials for 193 nm and 157 nm Immersion Lithography," SPIE Microlithography 30, San Jose, CA, Mar. 3, 2005.

J. Burnett et al., "High-Index Materials for 193 nm Immersion Lithography," 2$^{nd}$ International Symposium on Immersion Lithography, Bruges, Belgium, Sep. 15, 2005.

J. Burnett et al., "High-Index Materials for 193 nm Immersion Lithography," NIST Atomic Phys Div: DUV High Index Materials, Jul. 2005.

J. Burnett et al., "High-Index Materials for 193 nm Immersion Lithography," Proceedings of SPIE vol. 5754, Bellingham, WA, 2005, pp. 611-621. Conference: Optical Microlithography XVIII, San Jose, CA; Conference Date: Mar. 1, 2005; Publication Date: May 2005.

J. Burnett et al., "High-Index Materials for 193 nm Immersion Lithography," International SEMATECH Immersion Technology Advisory Group Meeting, Jan. 26, 2005.

X. Chuang et al., "$MgAl_2O_4$ Transparent Nano-Ceramics Prepared by Sintering under Ultrahigh Pressure," Key Engineering Materials, Vols. 280-283, Trans Tech Publications, Switzerland, 2005, pp. 549-552.

C. Huang et al., "Properties and Microstructure of Optically Transparent Polycrystalline Spinel," Key Engineering Materials, Vols. 280-283, Trans Tech Publications, Switzerland, 2005, pp. 545-548.

G.D. West et al., "Transparent Fine-grained Oxide Ceramic," Key Engineering Materials, vols. 264-268, Trans Tech Publications, Switzerland, 2004, pp. 801-804.

R. Apetz et al., "Transparent Alumina: A Light-Scattering Model," *J Am. Ceram. Soc.*, 86(3) 480-486 (2003).

R. Cook et al., "A new powder production route for transparent spinel windows: powder synthesis and window properties," Proc. SPIE vol. 5786, p. 41-47, Window and Dome Technologies and Materials IX; Randal W. Tustison; Ed, 2005.

J.D. Woosley et al., "Photoelectric Effects in Magnesium Aluminum Spinel", Phys. Rev. B, vol. 22, p. 1065 (1980).

G. Roblin, "Problemes poses par la conception d'un objectif photoreducteur fonctionnant en UV" [Problems posed by the design of a photoreducing objective operating in the UV] from J. Optics (Paris), 1984, vol. 15 No. 4 pp. 281-285. with English translation.

Translated Japanese Office Action corresponding to JP Appl No. JP 2007-544820, dated May 17, 2011.

Korean Office Action, with English translation, for KR Appl No. 10-2007-7012857, dated Aug. 10, 2012.

\* cited by examiner

FIG. 1

FIG. 2
Scattered light proportion [%]

Crystallite size D [μm]

FIG. 3
Scattered light proportion [%]

Pore size Dv [μm]

TRANSMITTING OPTICAL ELEMENT AND OBJECTIVE FOR A MICROLITHOGRAPHIC PROJECTION EXPOSURE APPARATUS

This application is the National Phase of International Patent Application Serial No. PCT/EP2005/013166, filed on Dec. 8, 2005, which claims benefit under 35 U.S.C. 119(e)(1) of U.S. Provisional Application No. 60/634,792 filed Dec. 9, 2004, of U.S. Provisional Application No. 60/646,046 filed Jan. 21, 2005, and of U.S. Provisional Application No. 60/715,813 filed Sep. 9, 2005.

The disclosure of U.S. Provisional Application 60/634,792 filed Dec. 9, 2004, of U.S. Provisional Application No. 60/646,046 filed Jan. 21, 2005, and of U.S. Provisional Application No. 60/715,813 filed Sep. 9, 2005 is considered part of and is incorporated by reference in the disclosure of this application.

BACKGROUND OF THE INVENTION

1. Field of the Invention

The invention relates to a transmitting optical element adapted for use in an objective in a projection exposure apparatus for microlithography and to an objective in a projection exposure apparatus for microlithography. The invention relates in particular to an objective having at least one optical element.

2. Prior Art

Projection exposure apparatus for microlithography are used to produce semiconductor devices and other finely structured components, such as integrated circuits or LCDs. Such a projection exposure apparatus contains not only a light source and an illumination system for illumination of a photomask or a reticle, but also a projection objective, which projects the pattern of the reticle onto a light-sensitive substrate, for example a silicon wafer which has been coated with a photoresist.

So far, three approaches in particular have been adopted in order to produce ever smaller structures in the order of magnitude of less than 100 nm: Firstly, attempts are made to enlarge to an ever greater extent the image-side numerical aperture NA of the projection objectives. Secondly, the wavelength of the illumination light is reduced ever further, preferably to wavelengths of below 250 nm, for example 248 nm, 193 nm, 157 nm or even less. Finally, further measures are used to improve the resolution, such as phase-shifting masks, multipole illumination or oblique illumination.

Another approach to increase the resolution capability is based on the idea of introducing an immersion liquid into the intermediate space which remains between the last optical element on the image side of the projection objective, in particular a lens, and the photoresist or another light-sensitive layer that is to be exposed. This technique is referred to as immersion lithography. Projection objectives which are designed for immersion operation are for this reason also referred to as immersion objectives.

The advantages of immersion lithography are due to the fact that the higher refractive index of the immersion liquid with respect to that of vacuum allows the illumination wavelength to be reduced to an effective illumination wavelength. This results in an increase in the resolution and the depth of focus.

When using immersion liquids with a high refractive index, a considerable increase of the incidence angle into the resist is possible in comparison to systems without immersion. This allows for a value of the numerical aperture (NA) of even more than 1.0. However, in order to allow maximum use of the advantage of high-refractive-index immersion liquids, it is necessary for the last optical element which is in contact with the immersion liquid to also have a high refractive index. In this case, "high" means a refractive index whose value at the given operating wavelength is considerably greater, that is to say by more than 10%, than that of quartz ($n \approx 1.56$ at $\lambda = 193$ nm).

For optical elements in an objective in a projection exposure apparatus for microlithography at wavelengths of less than 250 nm either single crystal materials, such as calcium fluoride ($CaF_2$) or quartz glass, are used as materials so far. However, quartz glass has not only a relatively low refractive index of 1.56 at a wavelength of 193 nm, but in addition qua glass has the disadvantage that local density changes occur when the UV radiation load is high, which lead to a deterioration in the imaging quality.

When using single crystal materials, such as $CaF_2$, the problem of local density changes due to UV radiation does not occur. The refractive index of $CaF_2$ at a wavelength of 193 nm is, however, only 1.5016. In addition, in $CaF_2$ the effect of intrinsic birefringence becomes noticeable in this wavelength range and to an even greater extent at shorter operating wavelengths, such as 157 nm. The relationship between the refractive index and the polarization state of the incident light that is caused by the intrinsic birefringence restricts the imaging quality of the projection objectives produced using these materials. Complex compensation measures, such as specific objective designs with combinations of different birefringent lens materials or crystal orientations are therefore required in order to ensure adequate imaging quality of such projection objectives.

Further crystal materials which may be used in a projection objective for microlithography, such as lithium fluoride (LiF), barium fluoride ($BaF_2$), potassium fluoride (KCl), sodium fluoride (NaCl) or sapphire ($Al_2O_3$) am mentioned in the article by G. Roblin, "Problèmes posés par la conception d'un objectif photoréducteur fonctionnant en UV" [Problems posed by the design of a photoreducing objective operating in the UV] from J. Optics (Pais), 1984, Vol. 15 No. 4 pages 281-285.

John H. Burnett et al., "High Index Materials for 193 nm and 157 nm Immersion Lithography" International Symposium on Immersion & 157 nm Lithography, Vancouver, Feb. 8, 2004 likewise mentions a range of materials for use in a projection objective for microlithography, in particular in an immersion objective, also including alkaline-earth metal-oxide single crystals such as magnesium oxide (Mgo) calcium oxide (CaO), strontium oxide (SrO) or barium oxide (BaO) as well as mixed crystals such as $MgAl_2O_4$ (magnesium spinel or spinel) or $Mg_xCa_{1-x}O$. However, all of these materials exhibit considerable intrinsic birefringence (often referred to as IBR) even at 193 nm. For example, measurements of the IBR-dependent retardation for magnesium spinel have produced a value of 52 nm/cm for magnesium spinel at a wavelength of $\lambda = 193$ nm. As a consequence very similar problems to those when using $CaF_2$ arise.

A further difficulty with the use of single crystal material for optical elements is the production of the blanks, since the growth of single crystals is a highly elaborate process. The single crystal blanks generally have cylindrical symmetry, in particular even a cylindrical shape When manufacturing optical elements for a projection objective whose geometry often differs to a major extent from the cylindrical symmetry or cylindrical shape of the blanks, it is therefore generally necessary to remove a considerable amount of material. In addition to the loss of material associated with this, this also results in specific manufacturing problems, depending on the material characteristics, such as the hardness or the cleavability of the crystals used.

In addition to glasses and single crystals, polycrystalline solids are also known as optical materials. For example, U.S. Pat. No. 6,406,769 discloses the provision of a cover glass composed of polycrystalline spinel for wristwatches.

U.S. Pat. No. 5,536,244 discloses a closure window composed of single crystal or polycrystalline spinel for an endoscope.

In conjunction with recent developments in the field of nanoceramics, optically transparent nanocrystalline oxides have become known. For example, the article by G. D. West, J. M. Perkins and M. H. Lewis, "Transparent Fine-Grained Oxide Ceramics", Key Engineering Materials, Vols. 264-268 (2004), pages 801-804 discloses especially for polycrystalline $Al_2O_3$ that the transparency increases as the grain size of the $Al_2O_3$ crystallites decreases.

A method for production of nanocrystalline $MgAl_2O_4$ with crystallite sizes of less than 100 nm is disclosed in the article by Xianghui Chang et al., "$MgAl_2O_4$ Transparent Nano-Ceramics Prepared by Sintering under High Pressure", Key Engineering Materials, Vols. 280-283 (2005), pages 549-552.

SUMMARY OF THE INVENTION

One object of the present invention is to provide an objective for a microlithographic projection exposure apparatus, which contains transmitting optical elements which allow the negative influences of intrinsic birefringence to be limited, with adequate transmission characteristics at the same time, together with relatively simple manufacture.

This object is achieved by a transmitting optical element which is composed of polycrystalline material and adapted for use in an objective in a projection exposure apparatus for microlithography.

Further aspects of the invention are an objective in a projection exposure apparatus for microlithography as disclosed herein and a projection exposure apparatus as disclosed herein, a method for production of a transmitting optical element for an objective in a projection exposure apparatus as disclosed herein, a blank as disclosed herein, a method for production of a transmitting optical element as disclosed herein, a method for production of an objective in a projection exposure apparatus as disclosed herein, and a use of a polycrystalline solid as disclosed here, a use of a material for production of a transmitting optical element as disclosed herein, as well as a method for microlithographic production of microstructured components as disclosed herein.

Advantageous refinements of the invention result from the features in the dependent claims and from the description.

The use of a polycrystalline material for a transmitting optical element for an objective in a projection exposure apparatus makes it possible to overcome the disadvantages of the prior art. In polycrystalline material individual monocrystalline units, also referred to as crystallites or grains, are arranged with their crystal axes oriented randomly in space. In addition to the projection objective, which projects the pattern of a reticle onto a light-sensitive substrate, a projection exposure apparatus may also include further objectives having at least one transmitting optical element in the illumination system. According to the invention, the use of transmitting optical elements composed of polycrystalline material is also advantageous in these objectives of the illumination system.

A polycrystalline blank for optical applications can be produced from high-purity powder raw material by sintering a blank followed by hot-isostatic pressing. In this way, it is possible to produce a blank which already at this stage has virtually the same geometry as the optical element to be manufactured from it. During the processing of a blank such as this in order to produce an optical element, the amount of material that has to be removed for final processing is correspondingly relatively small.

In projection exposure apparatus which are designed for immersion lithography, that optical element which is in contact with the immersion liquid is frequently in the form of an essentially hemispherical lens. In this case, the use of polycrystalline material is particularly advantageous, since a lens blank can in this case be produced directly in a spherical shape, for example by sintering and subsequent hot-isostatic pressing. The corresponding lens can be manufactured from a blank such as this with considerably less effort than from a cylindrical single crystal blank, by bisecting the spherical blank and, if required, simply carrying out relatively minor modifications to the hemispherical surface.

Because of the random orientation of the crystal axes in the individual crystalline units in a polycrystalline solid, the mean value of the intrinsic birefringence in all spatial directions is essentially zero. When using transmitting optical elements composed of polycrystalline material in an objective for a projection exposure apparatus for microlithography, for example in the projection objective, complicated arrangements for compensation for the intrinsic birefringence are avoided, such as those which are known, for example, for projection objectives with single crystal $CaF_2$ lenses.

In contrast to single crystal $CaF_2$, of which it is known that major disturbances occur in the optical homogeneity, so-called "Schlieren" (streaking) in specific crystal directions, the optical homogeneity of a polycrystalline solid does not vary with the incidence angle of the incident radiation.

A further advantage of polycrystalline material over single crystal material is that no anisotropies occur even during the material processing, for example during grinding or polishing.

In order to ensure adequate transparency of the optical element for the incident wavelength, it is one possibility to choose the size of the individual crystallites to be less than this wavelength. A mean crystallite size of less than $(\frac{2}{3})\lambda$, ore even less than $(\frac{1}{3})\lambda$ can be chosen, where $\lambda$ is the wavelength of the radiation that is used For use as an optical element in an objective in a projection exposure apparatus polycrystalline material which has a crystallite size of less than 500 nm, and even of less than 100 nm, is suitable in this case. Oxide materials which have crystallite sizes such as these are also referred to as "nanocrystalline ceramics".

However, its has turned out, that by the choice of the mean crystallite size of the polycrystalline material in the range from at least 0.5 micrometers to at most 100 micrometers, in particular from at least 10 micrometers to at most 100 micrometers, it becomes possible that—taking into account the light absorption mechanisms that occur in polycrystalline material on the one hand and the light scattering on the other hand—the optical element which is produced from the polycrystalline material is optimized in terms of its overall transmission and its performance with respect to unwanted light scattering.

In this case, the invention is based on the recognition that, for optimizing of the overall transmission and the performance with respect to light scattering of an optical element that has been produced from polycrystalline material, there is no need to choose the mean crystallite size to be so small that it is less than the wavelength being used. In fact, the inventors have found that the optimization of the overall transmission and performance with respect to scattered light of an optical element which is produced from polycrystalline material can already be achieved with a mean crystallite size of the individual crystallites which is significantly greater than the wavelength used, as will be described in more detail in the following.

For the purposes of the invention, the minimizing of the crystallite size down to less than the operating wavelength is thus deliberately dispensed with. In this case, on the one hand, the manufacturing problems which occur when minimizing the crystallite size in this way (with respect to the wavelengths used in microlithography in the DUV and VUV range of λ<250 nm) are avoided. On the other hand, this allows optimization of the absorption behavior of the material. This is based on the recognition that the absorption within the material is governed essentially by the concentration of foreign atoms, for which—in addition to the production process being carried out in extremely clean conditions—the crystallite size is likewise important. Since the overall concentration of the extraneous atoms introduced at the grain boundaries decreases as the crystallite size increases, the departure according to the invention from minimizing of the crystallite size down to less than the operating wavelength at the same the results in a reduction in the absorption that occurs in the material.

The choice of crystallite sizes in the range from 0.5 micrometers to 100 micrometers, in particular 10 micrometers to 100 micrometers, considerably above the typical operating wavelengths of λ<250 nm, furthermore allows the material to be optimized with regard to performance with respect to light scattering, since the production of scattered light in the polycrystalline material with regard to the crystallite size is based on effects that arm at least partly compensating each other. In this case, the invention is based on the recognition that the following mechanisms are primarily responsible for the occurrence of scattered light in the polycrystalline material:

a) birefringence when a beam passes through crystallites with different orientation;

b) total reflection on passing through grain boundaries at extremely high angles; and c) scattering on pores which are enclosed between the crystallites.

In this case, the emergence of scattered light resulting from (a) birefringence as a beam passes through the differently oriented crystallites on the one hand and the emergence of scattered light resulting from (b) total reflection at the grain boundaries on the other hand are effects which depend in an opposite sense on the mean crystallite size, respectively, so that (on the assumption of an ideal material with crystallites that are ideally joined to one another) this results in an optimum crystallite size value to the extent, in which the overall resultant influence of both effects on the production of scattered light is minimized.

To be more precise, theoretical investigations by the inventors with simulations using one dimensional "ray tracing" models as well as statistical analysis have shown that the intensity of the scattered light that is caused by birefringence of a beam through a medium with birefringence Δn (in nm/cm), with a mean crystallite size D and a thickness (=the distance which the beam travels through) L, can be described by:

$$I_{ret} = \frac{\pi^2 \Delta n^2}{3\lambda^2} \cdot LD \qquad (1)$$

The proportion of the scattered light which is caused by birefringence thus increases linearly with the crystallite size and with the square of the birefringence.

The proportion of scattered light caused by total reflection can be described by:

$$I_{tr} = \frac{L\Delta n}{\sqrt{3}\, nD} \qquad (2)$$

The proportion of the scattered light which is caused by total reflection is thus inversely proportional to the crystallite size, and is linearly dependent on the birefringence.

The combination of the two effects which are caused by scattering on crystallites/grain boundaries, that is to say (a) birefringence as the beam travels through the differently oriented crystallites on the one hand and (b) total reflection on the grain boundaries on the other hand results in a total scatted light intensity of:

$$I_{sum} = L\Delta n_{rms}\left(\frac{1}{nD} + \frac{\pi^2 \Delta n_{rms}}{\lambda^2} D\right) \qquad (3)$$

Figure 2:
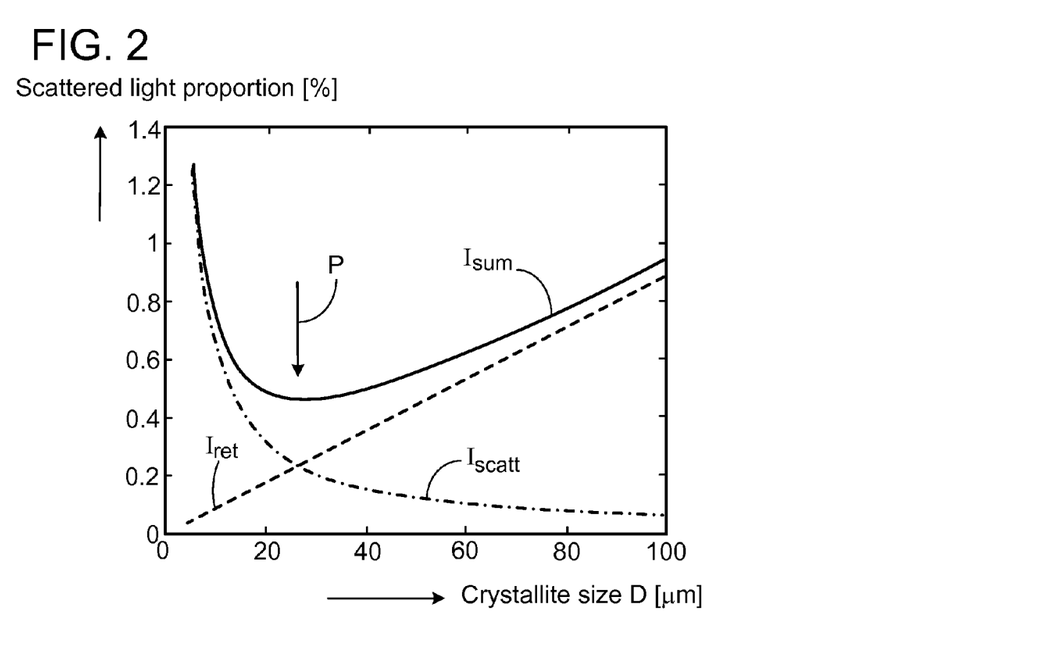
FIG. 2 shows a graph of the percentage of scattered light resulting from birefringence as the beam travels through differently oriented crystallites ($=I_{ret}$) and total reflection at the grain boundaries ($=I_{scatt}$) as a function of the crystallite size for one polycrystalline material according to one preferred embodiment.

The complementary dependencies of the proportion of scattered light from the crystallite size D, as is illustrated graphically in the diagram in FIG. 2, lead to the overall scattered light intensity resulting from birefringence and total reflection having a minimum value.

The optimum crystallite size $D_{opt}$ is obtained as a function of the operating wavelength λ (and the birefringence Δn from the condition:

$$D_{opt} = D\left(\frac{\partial I_{sum}}{\partial D} = 0\right) \qquad (4)$$

to be:

$$D_{opt} = \sqrt{\frac{\sqrt{3}\,\lambda^2}{\pi^2 n \Delta n}} \approx \sqrt{\frac{1}{6n\Delta n}}\,\lambda, \qquad (5)$$

where λ denotes the operating wavelength and where n denotes the refractive index and Δn the birefringence (in nm/cm) of the polycrystalline material at this operating wavelength, and where it is assumed that $$\Delta n_{rms} \approx \frac{1}{\sqrt{3}} \Delta n.$$

For example, with the values n=1.87, Δn=52 nm cm and λ=193 non for magnesium spinel, this results in the optimum value for the crystallite size D being approximately $D_{opt} \approx 25$ μm.

Thus, according to a further aspect of the invention, the condition $$D = \sqrt{\frac{1}{6n\Delta n}}\lambda$$

is essentially satisfied for the mean crystallite size D where λ denotes the operating wavelength, n the refractive index and Δn the birefringence of the polycrystalline material at this operating wavelength.

The criterion according to the invention on the basis of which the condition $$D = \sqrt{\frac{1}{6n\Delta n}}\lambda$$

is "essentially" satisfied for the mean crystallite size D is intended in this case and for the purposes of the present application to cover those situations in which the mean crystallite size D differs from the ideal value $$D = \sqrt{\frac{1}{6n\Delta n}}\lambda$$

by at most 50%, which is still regarded as being acceptable, but preferably by at most 20%.

With regard to the contribution of the scattered light resulting from the effect (c) of scattering on pores which are enclosed between the crystallites, theoretical investigations by the inventors have shown that, based on the assumption that all the pores will result in the light beams that strike them being scattered, the contribution of the pores to the scattered light is described by:

$$I_{sca} = \rho L D_V^2 \qquad (6)$$

where ρ is the pore density and $D_v$ is the pore diameter in the polycrystalline material. In this case, the overall pore volume is reduced by increasing the crystallite size, with the mean pore size increasing at the same time.

According to one preferred embodiment, the mean pore size for a pore density in the range of 1 to 10 pores/mm³ in the polycrystalline material is in the range from 0.5 micrometer to 2 micrometers, and is preferably approximately 1 micrometer or below. Pore sizes such as these around 1 micrometer lead to still acceptable scattered light proportions of less than 0.1% for typical dimensions of an optical element which has been produced from the polycrystalline material (for example magnesium spinel) of, for example, 4 cm, with this proportion of the scattered light increasing sharply in the range above approximately 2 micrometers by virtue of its square relationship from the pore size. In a particularly advantageous embodiment of the invention with respect to occurrence of scattered light, the pore size is in the range from 0.1 micrometer to 1 micrometer.

A farther advantage of using polycrystalline material for transmitting optical elements in an objective in a projection exposure apparatus for microlithography is, that in contrast to qua glass, no density changes, or only minor density changes, occur when applying UV radiation loads to polycrystalline materials with a sufficiently low defect concentration. They are therefore particularly suitable for use at positions in the objective where the radiation load is particularly severe, for example as the material for the optical element which is located closest to the image plane of the projection objective. Further highly loaded positions occur in the area of all the field planes and pupil planes in an objective in a projection exposure apparatus. Particularly when using multipole illumination, a high local radiation load occurs on a pupil plane, or at least in the area of a pupil plane. The high radiation load for an optical element which is arranged on a field plane, or at least in the area of a field plane, of the objective results from the fact that, with rectangular object fields, only subareas of a round optical element, such as for example a lens, are illuminated.

According to one preferred embodiment, the optical element is one of the three last optical elements on the image plane side, and is preferably the last optical element of the objective on the image plane side.

According to a farther preferred embodiment, the optical element is arranged in the region of a pupil plane or field plane.

It has been found that polycrystalline spinel ($MgAl_2O_4$), sometimes also referred to as magnesium spinel, is particularly advantageous for use as a material for transmitting optical elements, in particular for lenses. In the following text, the expression spinel is used as meaning not only the exactly stoichiometric compound $MgAl_2O_4$ but also a mixed crystal with the general formula MgO×m $Al_2O_3$, where m may have a value between 0.9 and 4. Polycrystalline spinel has good transmission for DUV wavelengths, in addition to having a high refractive index of about 1.8, or even 1.9, at a wavelength of 193 nm. Magnesium oxide likewise has a very high refractive index of 2.02 at 193 nm.

According to further embodiments, a different polycrystalline material which is transparent at the operating wavelength and has a cubic crystal structure can also be used. According to the invention, materials can be used for this purpose which, in the ideal single crystal form, have an energy gap of more than 7 eV, since these materials are still sufficiently optically transparent at operating wavelengths below 200 nm. For example, polycrystalline magnesium oxide (g) can be used in this context.

According to yet another embodiment of the invention, crystallites with the chemical composition $(M1)_3(M2)_5O_{12}$ (materials having this kind of molecular formula are generally referred to as garnets) are particularly suitable for this purpose, where M1 is a metal which is chosen from the group which contains yttrium, lanthanum, gadolinium, terbium, erbium, scandium and lutetium, and M is a metal which is selected from the group which contains aluminum, gallium, indium and thallium, that is to say, in particular and for example, polycrystalline yttrium aluminum garnet ($Y_3Al_5O_{12}$), polycrystalline scandium aluminum garnet ($Sc_3Al_5O_{12}$) or polycrystalline lutetium aluminum garnet ($Lu_3Al_5O_{12}$). Polycrystalline yttrium aluminum garnet (also known under the acronym YAG) appears to be particularly advantageous for use as a material for transmitting optical elements, in particular for lenses. Yttrium aluminum garnet has a high refractive index of more than 1.85 in addition to very good transmission for DIN wavelengths of less than 250 nm, in particular 248 nm or even for 193 am.

By virtue of these characteristics all of these materials are particularly suitable for use in an immersion objective, in particular as the material for the optical element which is in direct contact with the immersion liquid. It is desirable to provide a material with as high a refractive index as possible at this position. If the refractive index is too low in comparison to that of the immersion medium, the maximum achievable numerical aperture is reduced by refraction at the boundary surface.

A further advantage of spinel, magnesium oxide and garnets is their good chemical resistance to the normally used immersion media, such as water, phosphoric acid, sulfuric acid or organic substances such as hydrocarbons or perfluorinated ethers.

When using polycrystalline lens material in an objective in a projection exposure apparatus for microlithography, it is advantageous for the optical inhomogeneity to be less than 0.1 ppm. In this context, the expression optical inhomogeneity means the change in the wavefront with respect to the path length inside the lens.

For the optical element to have a transmission, in particular for the operating wavelength of the projection exposure apparatus that is as high as possible, it is advantageous for the overall impurity of the polycrystalline material to be less than 100 ppm, in particular less than 70 ppm. This is ensured by using raw materials with an overall impurity of less than 70 ppm for production of a polycrystalline blank in a method for production of a transmitting optical element adapted for use in an objective in a projection exposure apparatus for microlithography or in a method for production of an objective in a projection exposure apparatus for microlithography.

In a method for production of a transmitting optical element for use in an objective of a projection exposure apparatus and in a method for production of an objective in a projection exposure apparatus for microlithography, it is thus advantageous to sinter a polycrystalline blank under pressure, in order to reduce the number of cavities in the polycrystalline structure. The sintering process at a uniformly high pressure also advantageously affects the stress birefringence.

In one advantageous embodiment the optical element is contacted optically seamlessly onto a further optical element, also in particular onto a further optical element composed of a different material, for example quartz glass or $CaF_2$. Contacting between the optical element and a further optical element can be achieved by a technique which is often referred to as "optical contacting" or "wringing", which means a force-fitting connection between two solids, whose boundary surfaces are moved so close to one another that the intermolecular interaction causes the two solid bodies to adhere to one another. This results in a direct junction between the two optical elements for the transmitted radiation. The lack of any air gap between the optical elements allows, for example, for greater incidence angles. Polycrystalline material, in particular spinel, MgO or garnet, is actually particularly suitable for this connection technique since, in contrast to optical elements produced from single crystals, no anisotropies occur on the polished surface.

In another advantageous embodiment, the optical element is composed of at least two sub-elements made of polycrystalline material. This allows to manufacture an optical element of high thickness with significantly reduced effort by combining several comparatively thin elements. A typical maximum thickness of a transmitting optical element of semispherical shape which is arranged in an immersion objective close to the image plane lies in the range from about 30 to 50 mm. If such an optical element is produced according to the above described method by sintering and optional subsequent hot-isostatic pressing it is highly challenging to find appropriate processing conditions, such as for example heating and cooling programs, in order to achieve a sufficiently homogeneous optical quality of the final optical element throughout the complete volume of the optical element. However, by providing at least two sub-elements of a maximum thickness in the range of about 10 to about 20 mm to be connected to form the final optical element an appropriate quality can be assured by using a comparatively simple manufacturing process.

The sub-elements can be connected by optical contacting, fusion bonding at elevated temperature or by low temperature bonding at a temperature below 100° C. Low temperature bonding is performed by introducing a alkaline solution on the surfaces of two solids to be connected which promotes the formation of a connecting crystal network when the two surfaces are brought in close contact with each other. In some cases it turns out to be advantageous to apply a thin layer, for example composed of $SiO_2$, to at least one of the surfaces to be connected prior to the bonding process.

The surfaces of the sub-elements to be connected (herein referred to as connecting surfaces or contact surfaces) can be plane or of spherical shape or they can even have a slightly aspherical shape.

The connection of the sub-elements can be provided in such a way, that an intermediate space is provided between the sub-elements. This intermediate space can be filled with a gas or a liquid having a refractive index that is of the same size or even higher than the refractive index of water, which is 1.44 for light of a wavelength of 193 nm, and in particular higher than 1.5 in order to influence the overall refractive power of the optical element in a sensitive and variable way.

In another embodiment of the invention, the su-elements are made of different materials. This leads to a change of refractive index within the transmitting optical element itself.

An objective according to the invention is preferably designed for an operating wavelength of less than 250 nm, preferably of less than 200 nm, and furthermore preferably has a numerical aperture (NA) of more than 1.2, more preferably of more than 1.35, and even more preferably of more than 1.5.

The invention also relates to a microlithographic projection exposure apparatus, to the use of a polycrystalline material according to the invention for production of a transmitting optical element in an objective, and to a method for microlithographic production of microstructured components.

The invention will be explained in more detail in the following text with reference to exemplary embodiments which are illustrated in the attached figures.

BRIEF DESCRIPTION OF THE DRAWINGS

FIG. 5*a-d* shows a schematic illustration of a transmitting optical element according to one embodiment of the invention being composed of two sub-elements

DETAILED DESCRIPTION OF PREFERRED EMBODIMENTS

Figure 1:
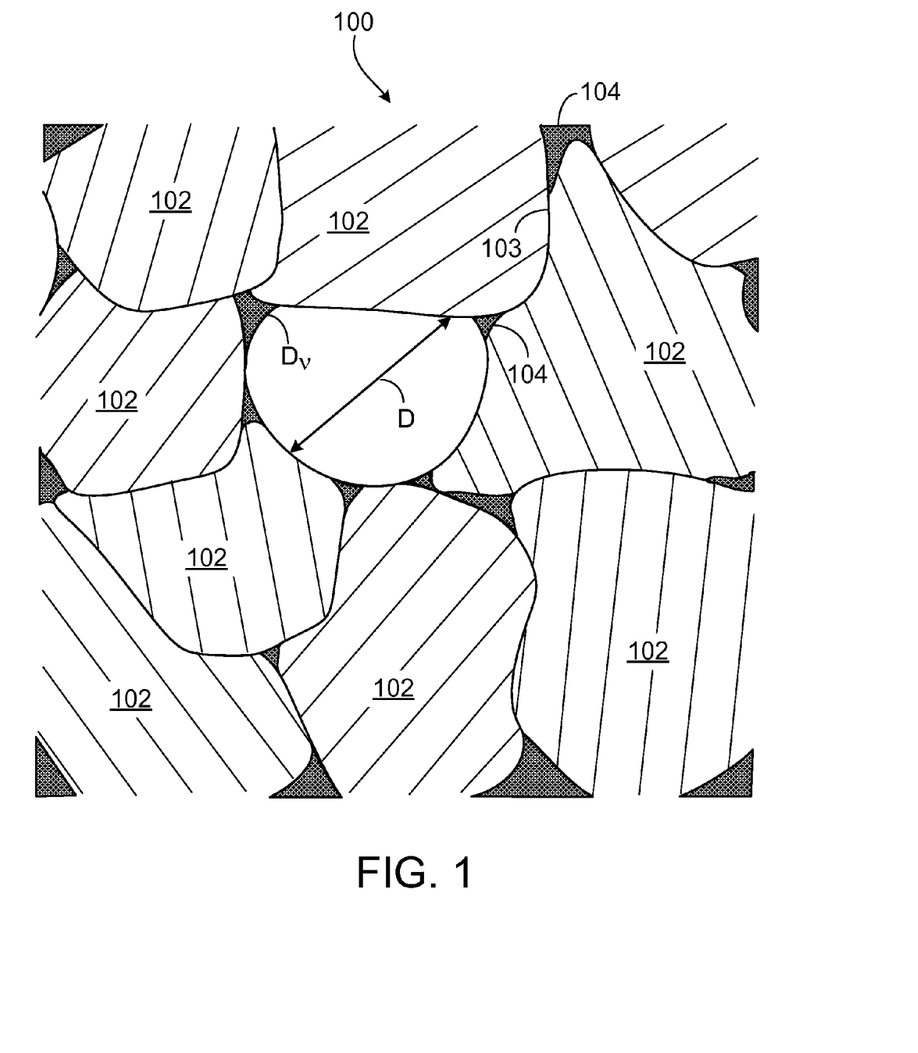
FIG. 1 shows a schematic illustration of a polycrystalline material used according to the invention.

FIG. 1 shows the configuration of a polycrystalline material, which is used according to the invention, schematically and not to scale. The material 100 is composed of polycrystalline magnesium spinel ($MgAl_2O_4$) and has a large number of differently oriented grains or crystallites 102, with areas of different crystal orientation being separated by grain boundaries 103. In the preferred exemplary embodiment, the mean crystallite size is approximately 25 µm. Gaps in the form of pores 104 are enclosed between the crystallites 102, with the mean size of the pores 104 being approximately 1 µm and a pore density of approximately 10 pores/$mm^3$.

In order to ensure optimum transmission of the polycrystalline material 100, it is necessary to ensure during production not only that the starting materials are highly pure, but also to ensure reaction control and post-treatment to allow optimum optical homogeneity and as low a concentration as possible of pores and cavities within the material. The stability of an optical element composed of a material such as this when subjected to intensive UV radiation is also highly dependent on the choice of a suitable production method, since the UV stability is directly con-elated with the number of defects in the crystal structure.

The polycrystalline material 100, for example polycrystalline spinel, can be produced from a polycrystalline spinel preliminary product which is produced by means of a precipitation reaction based on mixing of aqueous solutions of aluminum and magnesium salts and hydroxides. The precipitates are dried and are then burnt at temperatures of 400 to 900° C.

Care should be taken, that the initial compounds have an overall impurity of less than 70 ppm, and that no further contamination occurs during the production process, either. In addition to known methods for production of the preliminary products by precipitation reactions from the liquid phase, the pyrolysis method is particularly suitable, in which the contamination of the powder intermediate products can be reduced to less than 200 ppm, without any particular effort. This method is described in DE 2149640. In order to specifically produce particularly small grain size distributions in the powder raw materials and in the preliminary product, for example for producing nanocrystalline preliminary products, modern sol-gel processes have been found to be particularly suitable. A suitable sol-gel process is described in "A new powder production route for transparent spinel windows: powder synthesis and window properties" Ronald Cook, Michael Kochis, Ivar Reimanis, Hans-Joachim Kleebe, Proc. SPIE Vol. 5786, p. 41-47, Window and Dome Technologies and Materials IX; Randal W. Tustison; Ed.

A polycrystalline blank of high optical quality is produced by sintering, so that the enclosed pore volume is minimized and the density converges with the theoretical density of the ideal crystal, approximately 3.59 g/$cm^3$ in the case of spinel. In order to prevent any excessive increase in the crystallite size during the sintering process, temperatures below 1500° C. are preferred for this process. Optionally the sintering of the blank can be followed by a hot-isostatic pressing step.

The optical homogeneity of the optical element to be manufactured is selected by suitable process control during the cooling press of the sintered blank or by means of an annealing process, which follows the production process, so that the optical inhomogeneity does not exceed a value of 0.1 ppm, and the stress birefringence at $\lambda$=193 nm is less than 0.5 nm/cm. A blank for example for a hemispherical plano-convex lens, is produced by exerting pressure uniformly from all sides on a spherical blank in a hot-isostatic pressing process at temperatures around 1800° C., following which the spherical blank is bisected, and is ground and polished, with only a small amount of additional effort, to produce a plano-convex lens.

When an optical element according to the invention is being produced from other cubic crystal materials such as polycrystalline yttrium aluminum garnet ($Y_3Al_5O_{12}$) or polycrystalline magnesium oxide (MgO), appropriate matching of the process parameters, such as the pressure or sintering temperature, to the respective material characteristic may need to be carried out.

FIG. 2 shows the percentage of the scattered light $I_{ret}$ for a polycrystalline material composed of magnesium spinel ($MgAl_2O_4$) with a thickness of 4 cm resulting from birefringence occurring as the beam passes rough differently oriented crystallites 102, the percentage of scattered light $I_{scatt}$ resulting from total reflection occurring at the grain boundaries 103, and the proportion of the scattered light $I_{sum}$ overall which results from both effects, as a function of the crystallite A.

As can be seen from FIG. 2, a minimum value of approximately 0.5% (denoted by the arrow P) is obtained for the overall proportion of the scattered light $I_{sum}$ with a crystallite size of D=25 µm taking into account the effects, which lead to the creation of scattered light in the polycrystalline material, of (a) birefringence as the beam travels through the differently oriented crystallites on the one hand and (b) the total reflection at the grain boundaries on the other hand, for a typical thickness of 4 cm (corresponding to the distance that the light beam travels through).

For a polycrystalline material composed of magnesium spinel ($MgAl_2O_4$) with a thickness of L=4 cm and with a crystallite size of D≈50 µm results a root mean square value of the retardation of approximately 4 nm. The expression "retardation" denotes the difference between the optical path lengths of two orthogonal polarization states (that is to say polarization states perpendicular to one another). On this basis, a statistical model for a distribution of the crystallite sizes in the polycrystalline magnesium spinel ($MgAl_2O_4$) of between $D_{min}$=10 µm and $D_{max}$=100 µm results in a root mean square value for the retardation of approximately 4.5 nm, and a loss of contrast of 0.5%.

Figure 3:
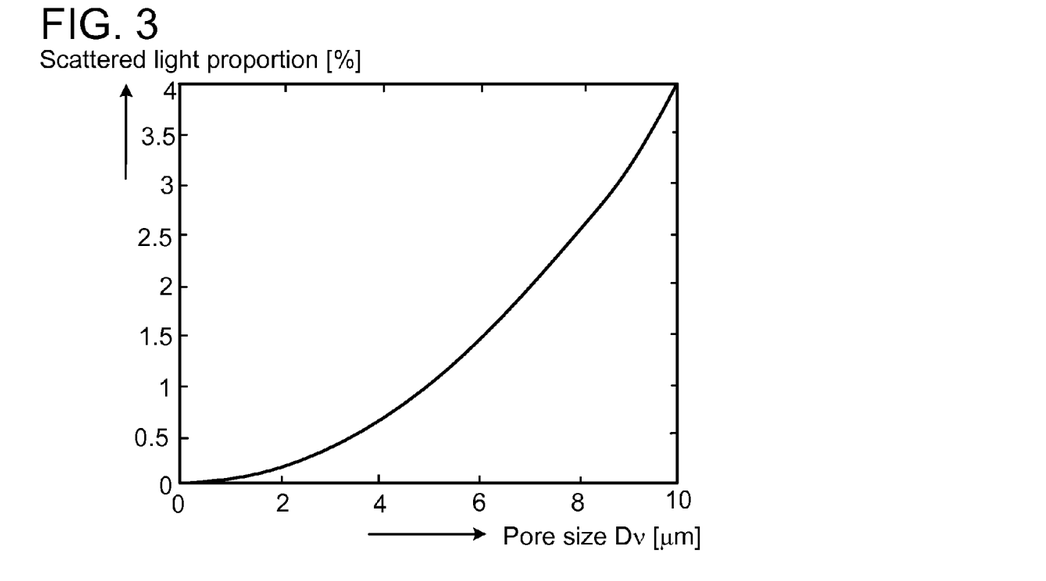
FIG. 3 shows a graph of the percentage of the scattered light resulting from scattering on pores which are enclosed between the crystallites of the polycrystalline material, as a function of the pore size for one polycrystalline material according to one preferred embodiment.

FIG. 3 shows the proportion of the scattered light (as %) resulting from light scattering on pores 104 which are enclosed between the crystallites 102 of the polycrystalline material 100, as a function of the pore size (in µm) for a polycrystalline material 100 composed of magnesium spinel ($MgAl_2O_4$) with a thickness of L=4 cm and with a pore density of 10 pores/$mm^3$.

As can be seen from FIG. 3, these parameters for a pore size of $D_v$≈1 µm result in a proportion of scattered light of less than 0.1% (to be more precise approximately 0.04%).

Figure 4:
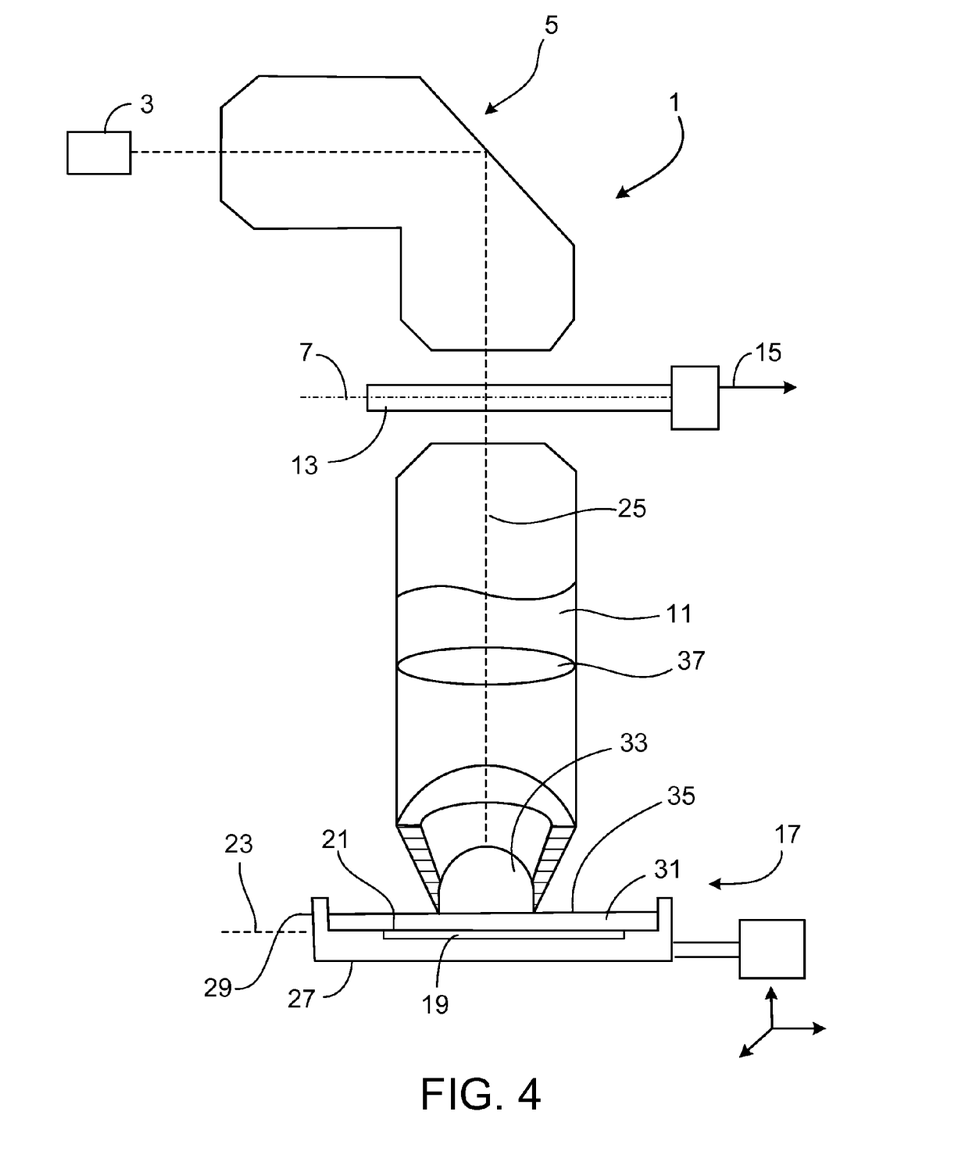
FIG. 4 shows a schematic illustration of a microlithographic projection exposure apparatus in which two optical elements according to the invention and composed of polycrystalline material are used.

FIG. 4 shows, schematically, a microlithographic projection exposure apparatus 1 which is intended for production of large-scale-integrated semiconductor components by means of immersion lithography.

The projection exposure apparatus 1 has an excimer laser 3 as the light source, with an operating wavelength of 193 nm. Alternatively, it would also be possible to use light sources with a different operating wavelength, for example 248 nm or 157 nm. A downstream illumination system 5 produces on its outlet plane or object plane 7 a large, sharply delineated, highly homogeneously illuminated illumination field, which is matched to the telecentericity requirements of the downstream projection objective 11. The illumination system 5 has devices for controlling the pupil illumination and for setting a predetermined polarization state for the illumination light. In particular, a device is provided which polarizes the illumination light in such a way that the oscillation plane of the electrical field vector runs parallel to the structures of a mask 13.

A device (reticle stage) for holding and moving the mask 13 is arranged in the beam path downstream from the illumination system 5 in such a way that it is located on the object plane 7 of the projection objective 11, and can be moved on this plane for scanning in the moving direction 15.

The object plane 7, which is also referred to as the mask plane, is followed underneath it by the projection objective 11, which projects an image of the mask on a reduced scale on a substrate 19, for example a silicon wafer, which is covered with a photoresist 21. The substrate 19 is arranged such that the planar substrate surface with the resist 21 coincides essentially with the image plane 23 of the projection objective 11. The substrate 19 is held by a device 17 which comprises a drive in order to move the substrate 19 in synchronism with the mask 13. This device 17 also has manipulators, in order to move the substrate 19 both in the z-direction parallel to the optical axis 25 of the projection objective 11 and in the x- and y-directions perpendicular to this axis. A tilting device having at least one tilting axis, running perpendicular to the optical axis 25, is integrated.

The device 17 (wafer stage) which is intended to hold the substrate 19 is designed for use in immersion lithography. It has a holding device 27, which can be moved in front of a scanner drive, and whose base has a flat recess for holding the substrate 19. A circumferential rim 29 forms a flat liquid-tight holder, which is open at the top, for an immersion liquid 31. The height of the rim is of such a size that the immersion liquid 31 with which it is filled can completely cover the substrate surface with the resist 21, and the outlet-side end area of the projection objective 11 can be immersed in the immersion liquid when the working distance between the objective outlet and the substrate surface is set correctly.

The projection objective 11 preferably has an image-side numerical aperture NA of at least NA=1.2, but more preferably more than 1.35, and particularly preferably more than 1.5.

The projection objective 11 has a hemispherical plano-convex lens 33 as the last optical element next to the image plane 23, whose exit surface 35 is the last optical surface of the projection objective. The exit side of the last optical element is completely immersed in the immersion liquid during operation of the projection exposure apparatus, and is wetted by it. The hemispherical plano-convex lens 33 is produced from polycrystalline spinel in the same way as the further lens 37, with the mean crystallite size and the pore size being chosen in accordance with the embodiments described above.

The planar-convex lens 33 and the further lens 37 are optionally provided with an antireflective coating This antireflective coating is composed of a sequence of materials which alternately have low refractive indices and high refractive indices. as low-refractive-index materials, particularly for an operating wavelength of the projection exposure apparatus 1 of 193 nm. $Mg_2$, $AlF_3$, $Na_5Al_3F_{14}$, $Na_3AlF_6$, $SiO_2$, LiF and NaF may be used. $LaF_3$, $GdF_3$, $NdF_3$, $Al_2O_3$ and $DyF_3$ are suitable for use as the high-refractive-index materials.

A band gap of 9 eV is known for spinel from the literature, for example from the article by J. D. Woosley, C. Wood, E. Sonder, and R. A. Weeks, "Photoelectric Effects in Magnesium Aluminum Spinel", Phys. Rev. B, Vol. 22, page 1065 (1980). From this value a theoretical absorption edge of 160 nm can be derived. Spinel can therefore be used not only as an optical material in a projection exposure apparatus with an operating wavelength of 248 nm, but also of 193 nm and less. MgO has a band gap of about 7 eV, correspondingly also ensuring sufficient transmission for light at a wavelength of 193 nm for this material as well. This also applies to YAG, which has a band gap of more than 7 eV.

The refractive index of polycrystalline spinel is likewise known from the literature and, in accordance with the "Handbook of optical constants of solids II, E. D. Palik (Ed.), San Diego, 1998, can be specified using a Sellmeier formula of the form $$n^2 - 1 = \frac{18.96 \times 10^9}{(100.080)^2 - v^2} + \frac{1.2234 \times 10^6}{(527.18)^2 - v^2}$$

where v is the frequency of the transmitted light in wave numbers. According to this formula, the refractive index at a wavelength of 193 nm is 1.8.

According to more recent measurements the band gap of spinel is rather about 7.7 eV and its refractive index about 1.9, respectively In another advantageous embodiment of an objective according to the invention, an optical element composed of polycrystalline material, for example of spinel, is optically contacted onto a further optical element composed of the same material or of a different material. Spinel has a linear coefficient of thermal expansion of $7 \cdot 10^{-6} K^{-1}$.

If optical elements composed of different materials are optically contacted onto one another, care should be taken to ensure that the respective Bear coefficients of thermal expansion do not differ excessively. Otherwise, the different expansion of the two materials when heated can result in the connection becoming detached. By way of examples a combination of spinel with MgO or YAG is optimum, both of which have a linear thermal coefficient of expansion of $8 \cdot 10^{-6} K^{-1}$. These materials can also be combined with $CaF_2$ ($25 \cdot 10^{-6} K^{-1}$) or quartz glass ($0.51 \cdot 10^{-6} K^{-1}$). A combination with $BaF_2$ ($18 \cdot 10^{-6} K^{-1}$) is likewise highly suitable.

Figure 5:
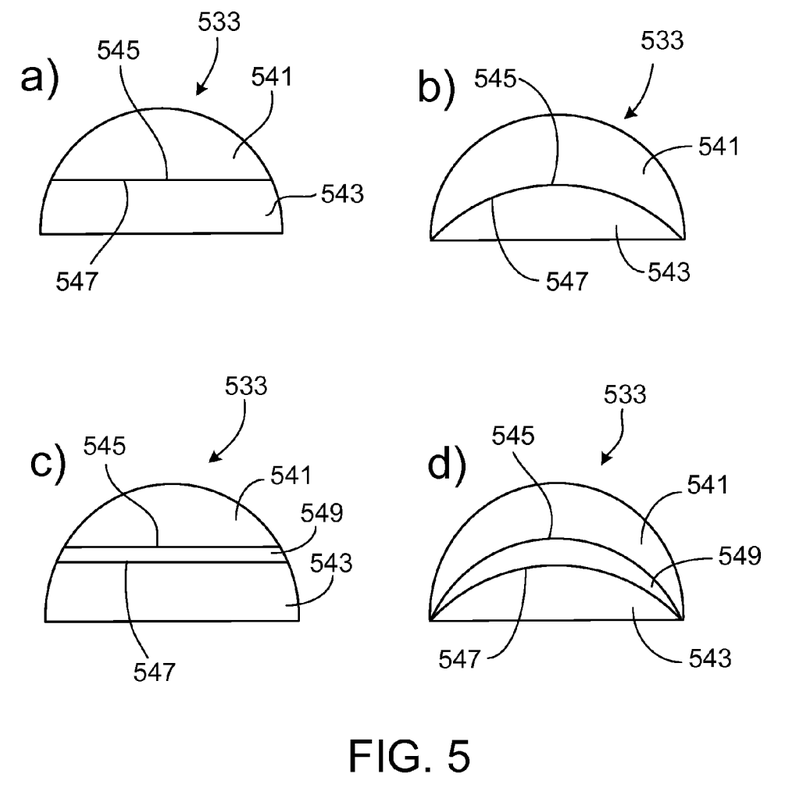

Further advantageous embodiments of the invention are shown in FIG. 5. FIG. 5a shows schematically a transmitting optical element 533 composed of two sub-elements 541 and 5437 which are connected by an optical contact connection between their contact surfaces 545 and 547 which are joined to form an optically seamless connection. In order to ensure a stable connection of these elements and to avoid stress occurring within the sub-elements 541 and 543 it is necessary to provide very plane contacting surfaces 545 and 547 which have negligible mismatch with respect to each other.

In FIG. 5b the contact surfaces 545 and 547 are not plane but have a spherical shape. Just like for the plane surfaces 545 and 547 shown in FIG. 5a it is essential that the spherical contact surfaces 545 and 547 according to FIG. 5b are worked and polished with very high accuracy prior to the contacting process in order to ensure a stable connection. If low temperature bonding or fusion bonding are used to connect sub-elements 541 and 543 a good connection can be achieved between contact surfaces 545 and 547 even when they fit slightly worse than in the case of optical contacting. This is due to the fact that during fusion bonding as well as during low temperature bonding the interface between contact surfaces 545 and 547 is subject to slight changes with respect to its shape so that a slight mismatch between surfaces 545 and 547 does not avert a stable connection between the sub-elements 541 and 543.

In FIGS. 5c and 5d two farther embodiments of the transmitting optical element 533 are shown. The optical element 533 according to FIG. 5c is again composed of two sub-elements 541 and 543 with plane contact surfaces 545 and 547. However, this time the sub-elements 541 and 543 are connected in such a way, that an intermediate space 549 is left between contact surfaces 547 and 545. This space can be filled with air, another gas or gas mixture or with a liquid. In order to assure an overall high refractive index of the optical element 533 a liquid is chosen that has a refractive index of 1.4, such as for example ultra pure water, or even higher. The intermediate space does not necessarily have to be of a plane parallel shape. It can as well be curved as shown in FIG. 5d, showing an optical element 533 composed of two sub-elements 541 and 543 with spherical contact surfaces.

Even though the invention has been described with reference to specific embodiments, those skilled in the art will also see numerous variations and alternative embodiments, for example by combination and/or replacement of features of individual embodiments. A person skilled in the art will accordingly understand that such variations and alternative embodiments of the present invention are also covered, and the scope of the invention is restricted only in the sense of the attached patent claims and their equivalents.

The invention claimed is:

1. A system, comprising:
 a housing;
 an objective in the housing, the objective comprising a plurality of optical elements comprising a transmitting optical element composed of polycrystalline material having a refractive index of more than 1.7 for a wavelength of less than 200 nm; and
 an immersion liquid in the housing,
 wherein the transmitting optical element composed of polycrystalline material is closest to an image plane of the objective.

2. The system according to claim 1, wherein the transmitting optical element comprises at least two sub-elements made of polycrystalline material.

3. The system according to claim 2, wherein the sub-elements are connected by optical contacting, fusion bonding or low temperature bonding.

4. The system according to claim 2, wherein between the sub-elements an intermediate space is provided, wherein the intermediate space is filled with gas or a liquid having a refractive index higher than 1.4.

5. The system according to claim 2, wherein a contact surface between at least two sub-elements or between at least one of the sub-elements and the intermediate space is of spherical shape.

6. The system according to claim 2, wherein the sub-elements are made of different materials.

7. The system according to claim 1, wherein the plurality of optical elements comprises a second optical element composed of polycrystalline material, and the second optical element is arranged in the area of a pupil plane of the objective.

8. The system according to claim 1, wherein the objective has a numerical aperture (NA) of more than 1.2.

9. The system according to claim 1, wherein the transmitting optical element is connected optically seamlessly to a further optical element.

10. The system according to claim 9, wherein a contact surface between the transmitting optical element and the further optical element is of spherical shape.

11. The system according to claim 9, wherein the transmitting optical element is connected to the further optical element by optical contacting, fusion bonding or low temperature bonding.

12. The system according to claim 9, wherein the further optical element is composed of the same material as the transmitting optical element.

13. The system according to claim 9, wherein the further optical element is composed of a different material than the transmitting optical element.

14. The objective according to claim 9, wherein the further optical element is composed of quartz glass.

15. The objective according to claim 9, wherein the further optical element is composed of calcium fluoride.

16. The system according to claim 1, wherein the objective is designed for an operating wavelength of less than 250 nm.

17. The system according to claim 1, wherein the immersion liquid is in direct contact with the transmitting optical element.

18. The system according to claim 17, wherein the immersion liquid comprises water.

19. The system according to claim 1, wherein the immersion liquid comprises water.

20. An apparatus, comprising:
 an illumination system;
 a device to hold a movable mask; and
 an objective comprising a transmitting optical element composed of polycrystalline material,
 wherein the polycrystalline material has a refractive index of more than 1.7 for a wavelength of less than 200 nm, and the apparatus is a microlithography projection exposure apparatus.

21. The projection exposure apparatus of claim 20, further comprising an immersion liquid between the transmitting optical element and a light-sensitive substrate.

22. The projection exposure apparatus according to claim 21, wherein the transmitting optical element is provided with a coating.

23. The projection exposure apparatus according to claim 21, wherein the polycrystalline material is selected from the group consisting of polycrystalline $MgAl_2O_4$, polycrystalline MgO, and polycrystalline yttrium aluminum garnet $Y_3Al_5O_{12}$.

24. The projection exposure apparatus according to claim 21, wherein the polycrystalline material is formed from crystallites with the chemical composition $(M1)_3(M2)_5O_{12}$, where M1 is a metal which is selected from the group consisting of yttrium, lanthanum, gadolinium, terbium, erbium, scandium and lutetium, and M2 is a metal selected from the group consisting of aluminum, gallium, indium, and thallium.

25. The projection exposure apparatus according to claim 21, wherein the polycrystalline material is a mixed crystal with the formula $MgO \times m\ Al_2O_3$, wherein m is a value between 0.9 and 4.

26. The projection exposure apparatus according to claim 21, wherein the polycrystalline material has a refractive index of more than 1.8 for a wavelength of less than 200 nm.

27. The projection exposure apparatus of claim 21, wherein the immersion liquid contacts the optical element.

28. The projection exposure apparatus according to claim 20, wherein the projection exposure apparatus is adapted to be operated at a wavelength of less than 250 nm.

29. The projection exposure apparatus according to claim 20, wherein the polycrystalline material is selected from the group consisting of polycrystalline $MgAl_2O_4$, polycrystalline MgO, and polycrystalline yttrium aluminum garnet $Y_3Al_5O_{12}$.

30. The projection exposure apparatus according to claim 20, wherein the polycrystalline material is formed from crystallites with the chemical composition $(M1)_3(M2)_5O_{12}$, where M1 is a metal which is selected from the group consisting of yttrium, lanthanum, gadolinium, terbium, erbium, scandium and lutetium, and M2 is a metal selected from the group consisting of aluminum, gallium, indium, and thallium.

31. The projection exposure apparatus according to claim 20, wherein the polycrystalline material is a mixed crystal with the formula MgO×m Al$_2$O$_3$, wherein m is a value between 0.9 and 4.

32. The projection exposure apparatus according to claim 20, wherein the transmitting optical element is provided with a coating.

33. The projection exposure apparatus according to claim 20, wherein the transmitting optical element comprises at least two sub-elements made of polycrystalline material.

34. The projection exposure apparatus according to claim 20, wherein the polycrystalline material has a refractive index of more than 1.8 for a wavelength of less than 200 nm.

35. The projection exposure apparatus according to claim 20, wherein the polycrystalline material has a refractive index of more than 1.9 for a wavelength of less than 200 nm.

* * * * *

UNITED STATES PATENT AND TRADEMARK OFFICE
CERTIFICATE OF CORRECTION

| | | |
|---|---|---|
| PATENT NO. | : 8,570,488 B2 | Page 1 of 2 |
| APPLICATION NO. | : 11/718146 | |
| DATED | : October 29, 2013 | |
| INVENTOR(S) | : Wilfried Clauss et al. | |

It is certified that error appears in the above-identified patent and that said Letters Patent is hereby corrected as shown below:

Col. 2, Title Page 2 under item (56), (Other Publications), line 12, delete "MgAl$_2$O$_4$" and insert -- MgAl$_2$O$_4$ --.

In the Specification

Col. 2, line 14, delete "qua" and insert -- quartz --.

Col. 2, line 36, delete "am" and insert -- are --.

Col. 2, line 40, delete "(Pais)," and insert -- (Paris), --.

Col. 2, line 48, delete "(Mgo):" and insert -- (MgO), --.

Col. 2, line 62, delete "shape" and insert -- shape. --.

Col. 4, line 42, delete "ore" and insert -- or --.

Col. 4, line 44, delete "used" and insert -- used. --.

Col. 4, line 50, delete "its" and insert -- it --.

Col. 5, line 25 (approx.), delete "the" and insert -- time --. (First occurrence)

Col. 5, line 35, delete "arm" and insert -- are --.

Col. 6, line 25, delete "hand" and insert -- hand, --.

Col. 6, line 25, delete "scatted" and insert -- scattered --.

Col. 6, line 39, delete "(and" and insert -- and --.

Col. 6, line 64, delete "nm cm" and insert -- nm/cm --.

Signed and Sealed this
Eleventh Day of March, 2014

Michelle K. Lee
*Deputy Director of the United States Patent and Trademark Office*

CERTIFICATE OF CORRECTION (continued)
U.S. Pat. No. 8,570,488 B2

Col. 6, line 65, delete "non" and insert -- nm --.

Col. 7, line 61, delete "farther" and insert -- further --.

Col. 7, line 64, delete "qua" and insert -- quartz --.

Col. 8, line 19, delete "farther" and insert -- further --.

Col. 8, line 42, delete "(g)" and insert -- (MgO) --.

Col. 8, line 49, delete "M" and insert -- M2 --.

Col. 8, line 60, delete "DIN" and insert -- DUV --.

Col. 8, line 61, delete "am." and insert -- nm. --.

Col. 8, line 62, delete "characteristics" and insert -- characteristics, --.

Col. 9, line 34, delete "embodiment" and insert -- embodiment, --.

Col. 10, line 8, delete "a" and insert -- an --.

Col. 10, line 28, delete "su-elements" and insert -- sub-elements. --.

Col. 11, line 62, delete "press" and insert -- process --.

Col. 11, line 66, delete "blank" and insert -- blank, --.

Col. 12, line 16, delete "rough" and insert -- through --.

Col. 12, line 21, delete "A." and insert -- size. --.

Col. 12, line 65, delete "telecentericity" and insert -- telecentricity --.

Col. 13, line 53, delete "coating" and insert -- coating. --.

Col. 13, line 58, delete "$Mg_2$" and insert -- $MgF_2$, --.

Col. 14, line 31, delete "Bear" and insert -- linear --.

Col. 14, line 34, delete "examples" and insert -- example, --.

Col. 14, line 43, delete "5437" and insert -- 543, --.

Col. 14, line 66, delete "farther" and insert -- further --.